US012764973B2

(12) United States Patent
King et al.

(10) Patent No.: US 12,764,973 B2
(45) Date of Patent: Oct. 13, 2026

(54) NEURAL NETWORK SYSTEM, HIGH EFFICIENCY EMBEDDED-ARTIFICIAL SYNAPTIC ELEMENT AND OPERATING METHOD THEREOF

(71) Applicant: NATIONAL TSING HUA UNIVERSITY, Hsinchu (TW)

(72) Inventors: Ya-Chin King, Hsinchu (TW); Hsin-Yuan Yu, Hsinchu (TW); Chrong-Jung Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 1085 days.

(21) Appl. No.: 17/813,599

(22) Filed: Jul. 19, 2022

(65) Prior Publication Data

US 2023/0292533 A1 Sep. 14, 2023

(30) Foreign Application Priority Data

Mar. 9, 2022 (TW) ................................ 111108656

(51) Int. Cl.
*H10B 63/00* (2023.01)
*G06N 3/065* (2023.01)
(Continued)

(52) U.S. Cl.
CPC ............. *H10B 63/82* (2023.02); *G06N 3/065* (2023.01); *G11C 11/54* (2013.01); *G11C 13/003* (2013.01);
(Continued)

(58) Field of Classification Search
CPC ........ H10B 63/82; H10B 63/30; G06N 3/065; G11C 11/54; G11C 13/003; G11C 13/004;
(Continued)

(56) References Cited

U.S. PATENT DOCUMENTS

| | | | |
|---|---|---|---|
| 9,514,818 | B1 | 12/2016 | Roizin et al. |
| 9,805,770 | B1 | 10/2017 | Merced Grafals et al. |

(Continued)

FOREIGN PATENT DOCUMENTS

| | | | |
|---|---|---|---|
| TW | 201214307 | A | 4/2012 |
| TW | I728556 | B | 5/2021 |
| TW | I753532 | B | 1/2022 |

OTHER PUBLICATIONS

Hsin Yuan Yu, "HKMG CMOS embedded Artificial Synaptic Device (eASD) for High Speed Neuromorphic Computing Chip", Graduation Thesis Oral Defense for Master's Degree of Department of Institute of Electronics Engineering, National Tsing Hua University, dated on Jul. 22, 2021, oral presentation, Taiwan, R.O.C.

*Primary Examiner* — Jerome Leboeuf
(74) *Attorney, Agent, or Firm* — CKC & Partners Co., LLC

(57) ABSTRACT

A high efficiency embedded-artificial synaptic element includes a semiconductor substrate, a select transistor, a metal layer, a first memory transistor and a second memory transistor. The select transistor is disposed on the semiconductor substrate and includes a select gate structure, a drain region and a source region. The metal layer is connected to the drain region. The first memory transistor includes a first gate structure, a first electrode region and a first memristor. The second memory transistor includes a second gate structure, a second electrode region and a second memristor. The second electrode region and the first electrode region are connected to each other and form a connection region, which is connected to the metal layer. The first memristor is formed between the first gate structure and the connection region, and the second memristor is formed between the second gate structure and the connection region.

5 Claims, 12 Drawing Sheets

(51) Int. Cl.
*G11C 11/54* (2006.01)
*G11C 13/00* (2006.01)
*H10N 70/20* (2023.01)

(52) U.S. Cl.
CPC ........ *G11C 13/004* (2013.01); *G11C 13/0069* (2013.01); *H10B 63/30* (2023.02); *H10N 70/253* (2023.02)

(58) Field of Classification Search
CPC ............ G11C 13/0069; G11C 13/0061; G11C 2013/0083; G11C 2213/53; G11C 2213/72; G11C 2213/74; G11C 2213/78; G11C 2213/79; G11C 2213/82; G11C 13/0007; H10N 70/253
See application file for complete search history.

(56) References Cited

U.S. PATENT DOCUMENTS

| | | | | |
|---|---|---|---|---|
| 9,847,132 | B1 * | 12/2017 | Zheng | G11C 13/0069 |
| 10,847,224 | B1 * | 11/2020 | Li | G11C 13/004 |
| 2016/0093398 | A1 * | 3/2016 | Choi | G11C 17/165<br>365/100 |
| 2017/0221558 | A1 | 8/2017 | Hu et al. | |
| 2018/0159536 | A1 | 6/2018 | Swartzlander et al. | |
| 2019/0156208 | A1 | 5/2019 | Park et al. | |
| 2020/0350213 | A1 | 11/2020 | Ramkumar et al. | |
| 2021/0125663 | A1 | 4/2021 | Chang et al. | |
| 2021/0257405 | A1 | 8/2021 | Lesso | |
| 2022/0068378 | A1 * | 3/2022 | Chih | G11C 13/0007 |
| 2023/0223089 | A1 * | 7/2023 | Lin | G11C 7/24<br>365/185.17 |
| 2023/0292533 | A1 | 9/2023 | King et al. | |

* cited by examiner

100

NEURAL NETWORK SYSTEM, HIGH EFFICIENCY EMBEDDED-ARTIFICIAL SYNAPTIC ELEMENT AND OPERATING METHOD THEREOF

RELATED APPLICATIONS

This application claims priority to Taiwan Application Serial Number 111108656, filed Mar. 9, 2022, which is herein incorporated by reference.

BACKGROUND

Technical Field

The present disclosure relates to a high efficiency embedded-artificial synaptic element and an operating method thereof. More particularly, the present disclosure relates to a high efficiency embedded-artificial synaptic element based on a pair of complementary memristors and an operating method thereof, which are applied to a neural network system with high-speed computing and low-power consumption.

Description of Related Art

Applications of the Resistive Random-Access Memory (RRAM) have been widely investigated to solve the reliability issues in traditional computing units such as high-power consumption and low transmission efficiency. RRAM, also known as Memristor, which meets the requirements for data storage in the Internet of Things (IoT) era. Memristors have the effects of low-power consumption, high durability and high unit efficiency, and are indispensable memory components for the Computing In Memory (CIM) and the Neural Network (NN) systems. On the other hand, the NN reveals advantages in visual recognition and large-scale automatic system. Hence, combined NN with RRAM have shown great potential.

There are many structures that integrating the memory with the CIM and NN of the smart system today to further improve the computing power and the efficiency. Although memristors are one of the possible solutions for the next generation Von Neumann computing architectures, the logic gates of the memristors are not compatible with Complementary Metal-Oxide-Semiconductor (CMOS) logic circuits. In addition, the construction and training of the synaptic elements in the NN are mostly based on the mathematical models, which reflect the changes in the weights through the machine learning and algorithms, and input the training results into the functional model for verification. The lack of detailed representation of the silicon data makes the construction, training and validation of the synaptic elements difficult to apply to other models, and leads to standard inconsistencies in the accuracy applied to recognition and deep learning.

SUMMARY

According to one aspect of the present disclosure, a high efficiency embedded-artificial synaptic element includes a semiconductor substrate, a select transistor, a metal layer, a first memory transistor and a second memory transistor. The select transistor is disposed on the semiconductor substrate and includes a select gate structure, a drain region and a source region. The drain region and the source region are located on two opposite sides of the select gate structure, respectively. The metal layer is electrically connected to the drain region of the select transistor. The first memory transistor is disposed on the semiconductor substrate. The first memory transistor includes a first gate structure, a first electrode region and a first memristor. The second memory transistor is disposed on the semiconductor substrate. The second memory transistor includes a second gate structure, a second electrode region and a second memristor, and the second electrode region and the first electrode region are connected to each other to form a connection region. The connection region is electrically connected to the metal layer. The first memristor is formed between the first gate structure and the connection region, and the second memristor is formed between the second gate structure and the connection region.

According to another aspect of the present disclosure, an operating method of a high efficiency embedded-artificial synaptic element is provided. The high efficiency embedded-artificial synaptic element includes a select transistor, a metal layer, a first memory transistor and a second memory transistor. The first memory transistor includes a first gate structure and a first memristor. The second memory transistor includes a second gate structure and a second memristor. The operating method of the high efficiency embedded-artificial synaptic element includes performing a setting step, a writing step and a reading step. The setting step is performed to apply an initial voltage to the first gate structure and the second gate structure to set the first memristor and the second memristor in a low resistive state. The writing step is performed to apply a write voltage to one of the first gate structure and the second gate structure to reset one of the first memristor and the second memristor to a high resistive state. The first memristor and the second memristor correspond to a write bit. The reading step is performed to float a gate electrode of the select transistor, apply a read voltage to the first gate structure, and apply another read voltage to the second gate structure. An output voltage of the metal layer is determined according to the write bit.

According to yet another aspect of the present disclosure, a neural network system includes a plurality of the high efficiency embedded-artificial synaptic elements of the aforementioned aspect and a plurality of diodes. The high efficiency embedded-artificial synaptic elements are arranged in array. The metal layer of each of the high efficiency embedded-artificial synaptic elements generates an output voltage. The select gate structure of the select transistor of each of the high efficiency embedded-artificial synaptic elements arranged in column is coupled to a word line. The source region of the select transistor of each of the high efficiency embedded-artificial synaptic elements arranged in row is coupled to a bit line. The first gate structure of the first memory transistor of each of the high efficiency embedded-artificial synaptic elements arranged in row is coupled to a first electrode line. The second gate structure of the second memory transistor of each of the high efficiency embedded-artificial synaptic elements arranged in row is coupled to a second electrode line. Each of the diodes is coupled to the two metal layers of each two of the high efficiency embedded-artificial synaptic elements adjacent to each other in a vertical direction. Each of the diodes has an anode end, and the anode ends of the diodes arranged in row are connected to each other and gather an output current. Each of the diodes determines whether to conduct or not according to the two output voltages of the two metal layers of each two of the high efficiency embedded-artificial synaptic elements adjacent to each other in the vertical direction.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
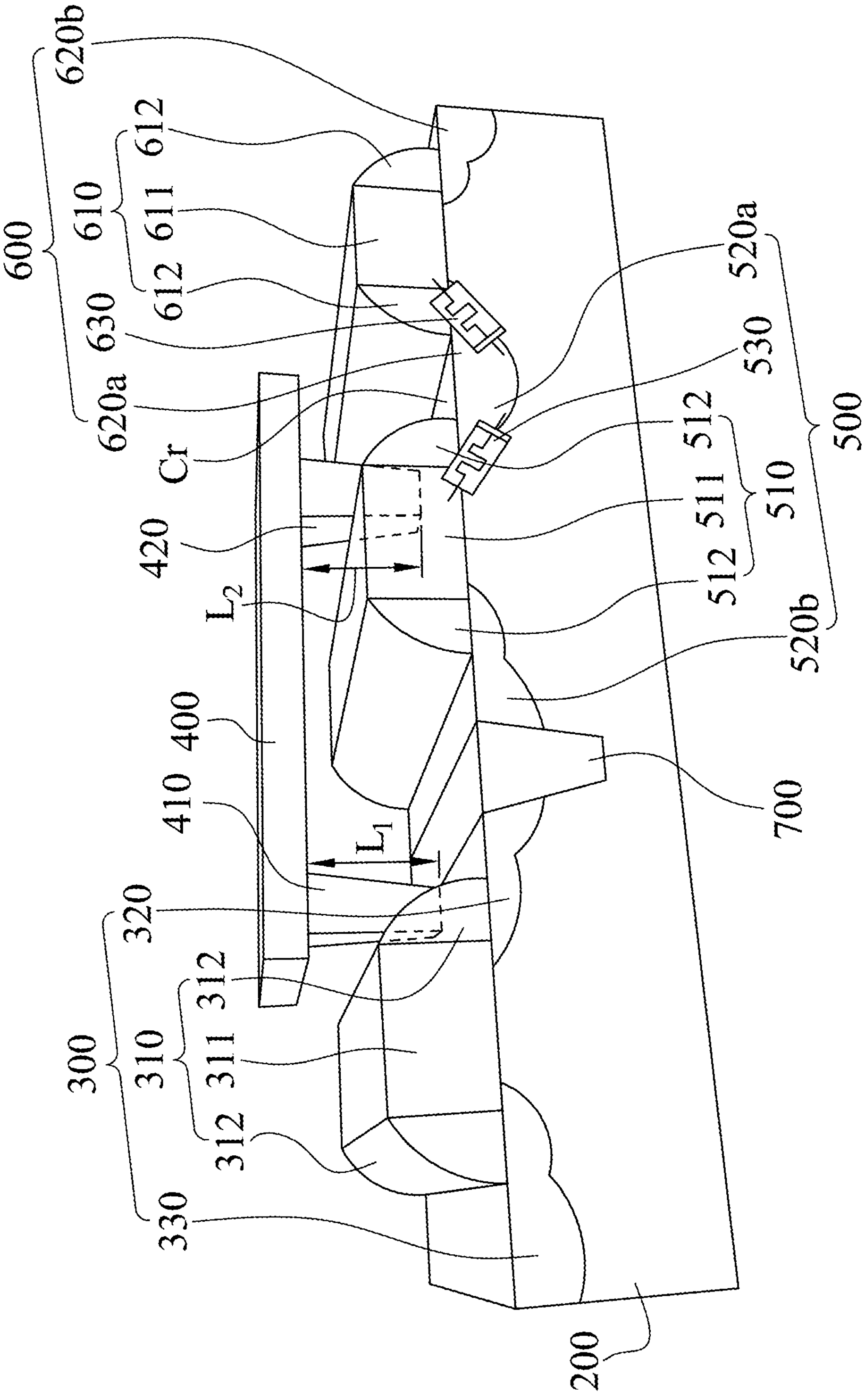
FIG. 1 shows a three-dimensional schematic view of a high efficiency embedded-artificial synaptic element according to a first embodiment of the present disclosure.
Figure 2:
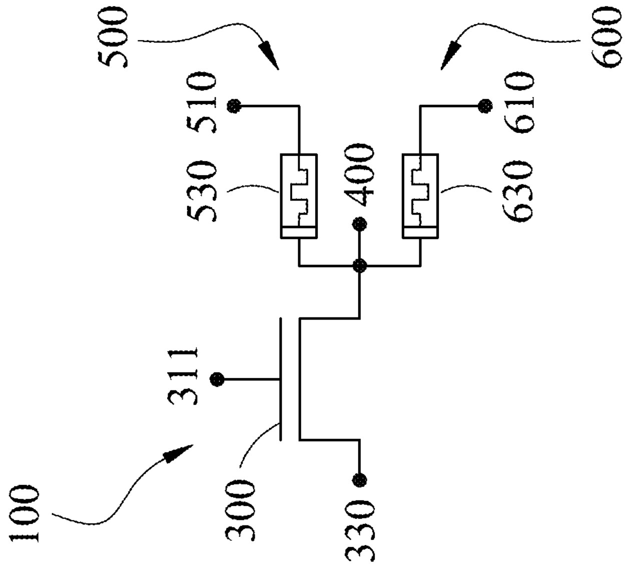
FIG. 2 shows an equivalent circuit diagram of the high efficiency embedded-artificial synaptic element of FIG. 1.

Please refer to FIGS. 1 and 2. FIG. 1 shows a three-dimensional schematic view of a high efficiency embedded-artificial synaptic element 100 according to a first embodiment of the present disclosure. FIG. 2 shows an equivalent circuit diagram of the high efficiency embedded-artificial synaptic element 100 of FIG. 1. As shown in FIGS. 1 and 2, the high efficiency embedded-artificial synaptic element 100 includes a semiconductor substrate 200, a select transistor 300, a metal layer 400, a first memory transistor 500 and a second memory transistor 600. All of the select transistor 300, the first memory transistor 500 and the second memory transistor 600 are disposed on the semiconductor substrate 200, and coplanar with each other. The first memory transistor 500 and the second memory transistor 600 are connected in series.

Specifically, the select transistor 300 includes a select gate structure 310, a drain region 320 and a source region 330. The drain region 320 and the source region 330 are located on two opposite sides of the select gate structure 310, respectively. The metal layer 400 is electrically connected to the drain region 320 of the select transistor 300. The first memory transistor 500 includes a first gate structure 510, a first electrode region 520*a* and a first memristor 530. The second memory transistor 600 includes a second gate structure 610, a second electrode region 620*a* and a second memristor 630, and the second electrode region 620*a* and the first electrode region 520*a* are connected to each other to form a connection region Cr. The connection region Cr is electrically connected to the metal layer 400. Especially, the first memristor 530 is formed between the first gate structure 510 and the connection region Cr, and the second memristor 630 is formed between the second gate structure 610 and the connection region Cr.

Therefore, the high efficiency embedded-artificial synaptic element 100 of the present disclosure utilizes the metal layer 400 to connect the drain region 320 of the select transistor 300 to the connection region Cr electrically, besides it can utilize the characteristics of the complementary resistive states between the first memristor 530 of the first memory transistor 500 and the second memristor 630 of the second memory transistor 600 to operate the twin bits in a high resistive state and a low resistive state, respectively, and form a structure of a Non-Volatile Memory Latch (NVM Latch). Hence, the data output characteristic of the high efficiency embedded-artificial synaptic element 100 is more stable and higher efficient than the analogy access used by the conventional logic gates.

In the first embodiment, the semiconductor substrate 200 can include elementary semiconductor materials, compound semiconductor materials, and/or alloy semiconductor materials. The elementary semiconductor materials are, for example, crystal silicon, polycrystalline silicon, amorphous silicon, germanium, and/or diamond. In addition, the select transistor 300 can be a High-K Metal Gate (HKMG) N-type field effect transistor with a 28 nanometer (28 nm) process, and both of the first memory transistor 500 and the second memory transistor 600 can be a N-type field effect transistor with the 28 nm process, but the present disclosure is not limited thereto.

In detail, the select gate structure 310 of the select transistor 300 can include a gate electrode 311 and a spacer 312. The spacer 312 surrounds the gate electrode 311, and can be formed by a single-layer structure or a multi-layer structure. The drain region 320 and the source region 330 are aligned with the spacer 312 on two opposite sides of the gate electrode 311. The first gate structure 510 of the first memory transistor 500 can include a gate electrode 511 and a spacer 512. The second gate structure 610 of the second memory transistor 600 can include a gate electrode 611 and a spacer 612. The structure and configuration between the gate electrode 511 and the spacer 512 are the same as the structure and configuration between the gate electrode 311 and the spacer 312 of the select transistor 300; similarly, the structure and configuration between the gate electrode 611 and the spacer 612 are not described again herein. It should be noted that the first memory transistor 500 can further include a first electrode region 520*b*, and the second memory transistor 600 can further include a second electrode region 620*b*. The first electrode regions 520*a*, 520*b* of the first memory transistor 500 can be a drain region and a source region in a transistor, and the second electrode regions 620*a*, 620*b* of the second memory transistor 600 can also be a drain region and a source region in a transistor, respectively. Hence, the connection region Cr of the first embodiment is mainly composed of two drain regions connected in series. In other embodiments, the connection region can be formed by two source regions of the different memory transistors.

Further, the high efficiency embedded-artificial synaptic element 100 can further include a first contact 410 and a second contact 420. The first contact 410 is electrically connected between the metal layer 400 and the drain region 320 of the select transistor 300. The second contact 420 is electrically connected between the metal layer 400 and the connection region Cr. It is worth noting that the first contact 410 has a length L1, the second contact 420 has a length L2, and the length L1 is equal to the length L2. Moreover, the high efficiency embedded-artificial synaptic element 100 can further include a Shallow Trench Isolation (STI) region 700. The STI region 700 is disposed on the semiconductor substrate 200 and located between the drain region 320 of the select transistor 300 and the first electrode region 520*b* of the first memory transistor 500. The STI region 700 is formed by removing a portion of the semiconductor substrate 200 to form a trench in the semiconductor substrate 200, and the aforementioned trench is filled with a dielectric material. The dielectric material can be silicon oxide, silicon nitride, silicon oxynitride, carbon-doped silicon oxide, or other STI materials. The STI region 700 is mainly configured to separate the active region between the select transistor 300 and the first memory transistor 500.

Figure 3:
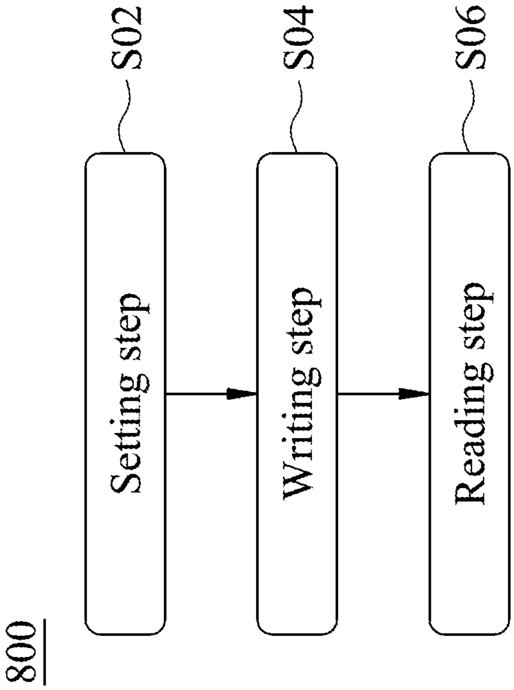
FIG. 3 shows a flow chart of an operating method of the high efficiency embedded-artificial synaptic element according to a second embodiment of the present disclosure.

Please refer to FIGS. 1, 2 and 3. FIG. 3 shows a flow chart of an operating method 800 of the high efficiency embedded-artificial synaptic element 100 according to a second embodiment of the present disclosure. As shown in FIG. 3, the operating method 800 of the high efficiency embedded-artificial synaptic element 100 can be applied to the high efficiency embedded-artificial synaptic element 100 of FIG. 2, and includes performing the setting step S02, the writing step S04 and the reading step S06. The following Table 1 lists each voltage applied to each terminal of the high efficiency embedded-artificial synaptic element 100 in the setting step S02, the writing step S04 and the reading step S06 of the operating method 800 of the high efficiency embedded-artificial synaptic element 100, and the operating method 800 of the high efficiency embedded-artificial synaptic element 100 of the present disclosure is described in more detail with the drawings and the embodiments below.

TABLE 1

| | Set | Write (X = 1) | Write (X = 0) | Read |
|---|---|---|---|---|
| the source region 330 | 0 V | 0 V | 0 V | Floating |
| the gate electrode 311 | 0.5 V | 1 V | 1 V | Floating |
| the first gate structure 510 | 3 V | 0 V | 2 V | 1 V |
| the second gate structure 610 | 3 V | 2 V | 0 V | 0 V |

Figure 4A:
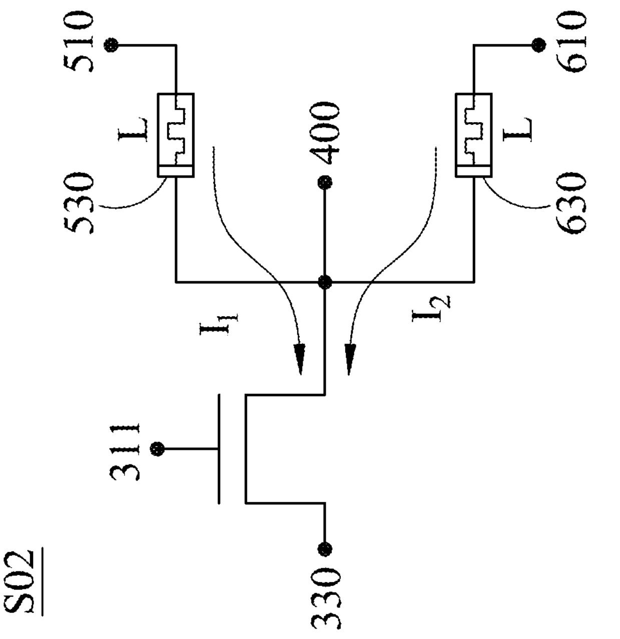
FIG. 4A shows a schematic view of a setting step of the operating method of the high efficiency embedded-artificial synaptic element of FIG. 3.
Figure 4B:
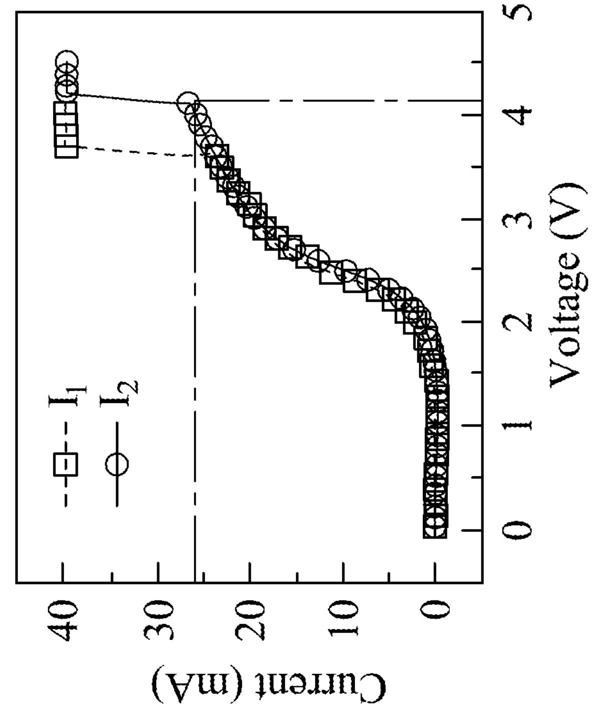
FIG. 4B shows a curve diagram of an initial current flowing through a first memristor and an initial current flowing through a second memristor of the setting step of FIG. 4A.

Please refer to FIGS. 3, 4A and 4B. FIG. 4A shows a schematic view of a setting step S02 of the operating method 800 of the high efficiency embedded-artificial synaptic element 100 of FIG. 3. FIG. 4B shows a curve diagram of an initial current $I_1$ flowing through the first memristor 530 and an initial current $I_2$ flowing through the second memristor 630 of the setting step S02 of FIG. 4A. As shown in FIG. 4A, the setting step S02 is performed to apply an initial voltage to the first gate structure 510 and the second gate structure 610 to set the first memristor 530 and the second memristor 630 in a low resistive state L. In detail, the high efficiency embedded-artificial synaptic element 100 needs to apply a high voltage to the terminals of the first gate structure 510 and the second gate structure 610 before performing the resistive switching, so that the first memristor 530 and the second memristor 630 are initially set and are in the low resistive state L (i.e., a low resistance). The initial voltage in the setting step S02 is the aforementioned the high voltage, which can be 3 V, but the present disclosure is not limited thereto. In addition, it can be seen from the equivalent circuit diagram in FIG. 4A and the curve diagram in FIG. 4B that in response to determining that both the first memristor 530 and the second memristor 630 are in the low resistive state L, the initial current $I_1$ flowing through the first memristor 530 is close to the initial current $I_2$ flowing through the second memristor 630, which represents that the symmetry between the first memristor 530 and the second memristor 630 of the present disclosure is high.

Figure 4C:
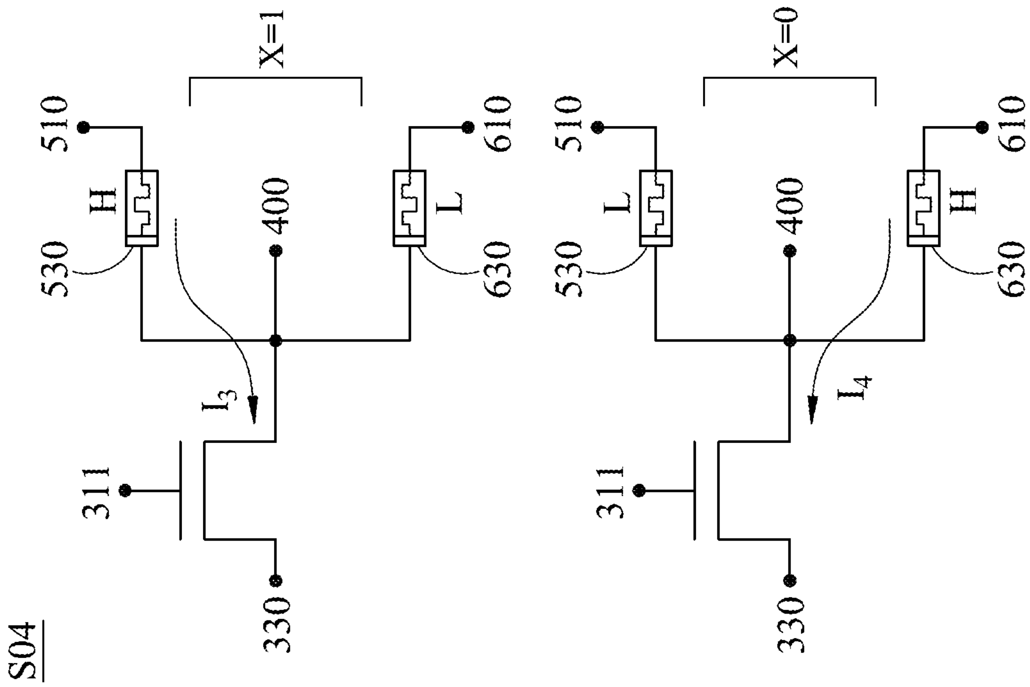
FIG. 4C shows a schematic view of a writing step of the operating method of the high efficiency embedded-artificial synaptic element of FIG. 3.
Figure 4D:
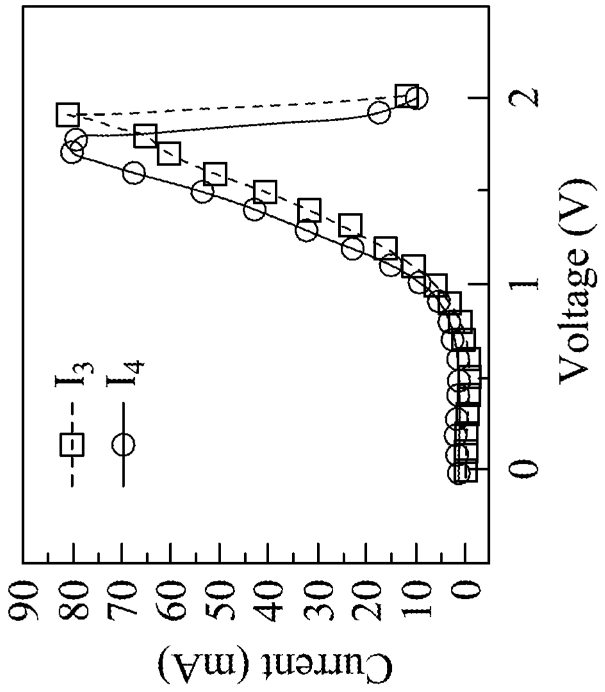
FIG. 4D shows a curve diagram of a reset current flowing through the first memristor and a reset current flowing through the second memristor in a high resistive state of the writing step of FIG. 4C.

Please refer to FIGS. 3, 4C and 4D. FIG. 4C shows a schematic view of a writing step S04 of the operating method 800 of the high efficiency embedded-artificial synaptic element 100 of FIG. 3. FIG. 4D shows a curve diagram of a reset current $I_3$ flowing through the first memristor 530 and a reset current $I_5$ flowing through the second memristor 630 in a high resistive state H of the writing step of FIG. 4C. As shown in FIG. 4C, the writing step S04 is performed to apply a write voltage to one of the first gate structure 510 and the second gate structure 610 to reset one of the first memristor 530 and the second memristor 630 to the high resistive state H. Especially, the current resistive state of the first memristor 530 and the current resistive state of the second memristor 630 correspond to a write bit X. In response to determining that the first memristor 530 is in the high resistive state H and the second memristor 630 is in the low resistive state L, the write bit X can be 1 (i.e., X=1 in FIG. 4C). In response to determining that the first memristor 530 is in the low resistive state L and the second memristor 630 is in the high resistive state H, the write bit can be 0 (i.e., X=0 in FIG. 4C).

In detail, the present disclosure applies a low voltage to the first gate structure 510 to reset the first memristor 530 from the low resistive state L of FIG. 4A to the high resistive state H (i.e., a high resistance) of FIG. 4C and simultaneously applies a high voltage to the second gate structure 610 to maintain the second memristor 630 in the low resistive state L, and the write bit X is defined as 1. On the contrary, the present disclosure applies the low voltage to the second gate structure 610 to reset the second memristor 630 from the low resistive state L of FIG. 4A to the high resistive state H of FIG. 4C and simultaneously applies the high voltage to the first gate structure 510 to maintain the first memristor 530 in the low resistive state L, and the write bit X is defined as 0. Hence, the high efficiency embedded-artificial synaptic element 100 implements the operation of writing 1 or 0 in the NVM Latch through the aforementioned process. The write voltage in the writing step S04 is the aforementioned low voltage, which can be 0 V, and the aforementioned high voltage can be 2 V, but the present disclosure is not limited thereto. In addition, it can be seen from the equivalent circuit diagram in FIG. 4C and the curve diagram in FIG. 4D that in response to determining that the first memristor 530 and the second memristor 630 are in the complementary resistive state, the reset current $I_3$ flowing through the first memristor 530 is close to the reset current $I_5$ flowing through the second memristor 630, which represents that the first memristor 530 and the second memristor 630 of the present disclosure still maintain low variability after the operation of the resistive switching.

Figure 4E:
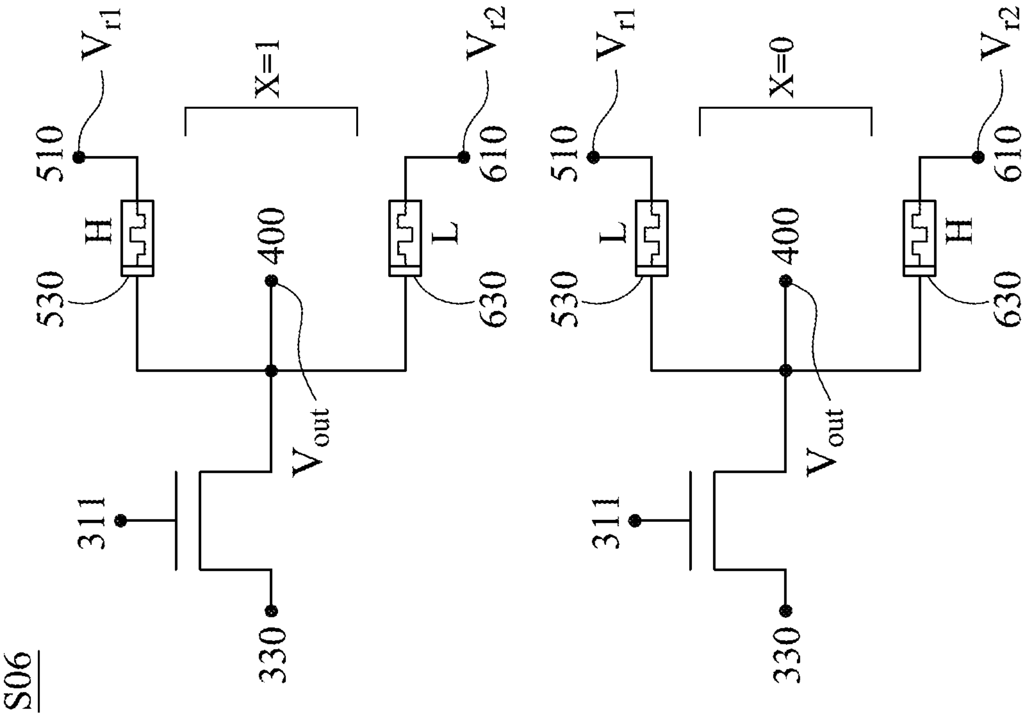
FIG. 4E shows a schematic view of a reading step of the operating method of the high efficiency embedded-artificial synaptic element of FIG. 3.
Figure 4F:
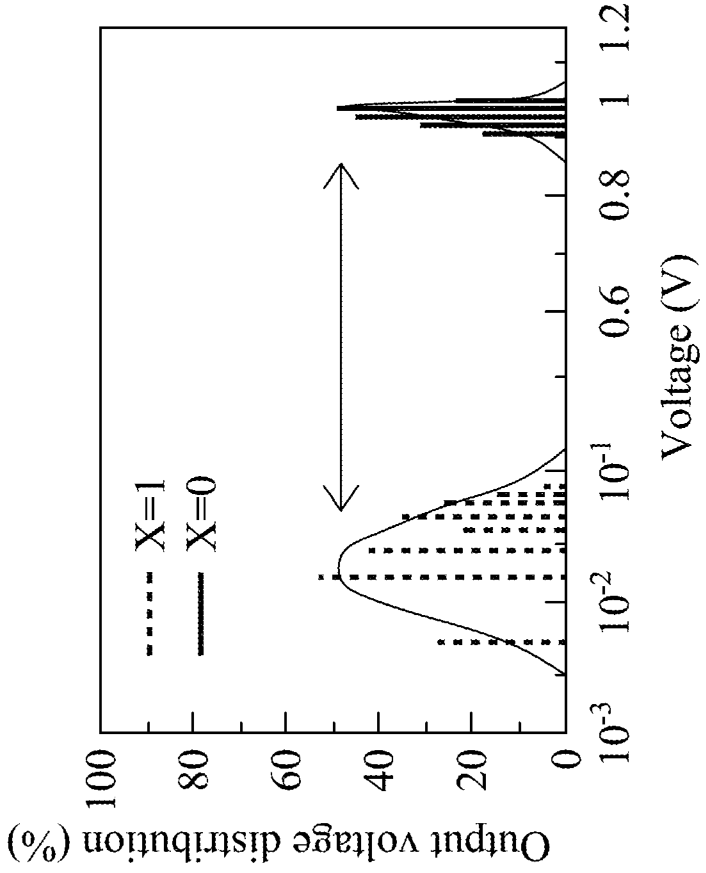
FIG. 4F shows an output voltage distribution diagram drawn by measuring a plurality of the high efficiency embedded-artificial synaptic elements operating at multiple different write bits.

Please refer to FIGS. 3, 4E and 4F. FIG. 4E shows a schematic view of a reading step S06 of the operating method 800 of the high efficiency embedded-artificial synaptic element 100 of FIG. 3. FIG. 4F shows an output voltage distribution diagram drawn by measuring a plurality of the high efficiency embedded-artificial synaptic elements 100 operating at multiple different write bits X. As shown in FIG. 4E, the reading step S06 is performed to float the gate electrode 311 of the select transistor 300, apply a read voltage $V_{r1}$ to the first gate structure 510, and apply another read voltage $V_{r2}$ to the second gate structure 610, and then an output voltage $V_{out}$ of the metal layer 400 is captured, and the output voltage $V_{out}$ is determined according to the write bit X. The read voltage $V_{r1}$ is greater than the read voltage $V_{r2}$. In response to determining that the write bit X is 1, the output voltage $V_{out}$ can approach the read voltage $V_{r2}$ (i.e., 0 V in Table 1). In response to determining that the write bit X is 0, the output voltage $V_{out}$ can approach the read voltage $V_{r1}$ (i.e., 1 V in Table 1).

In detail, the high efficiency embedded-artificial synaptic element 100 continues to perform the read operation after the writing operation is completed. In the reading step S06, the select transistor 300 is turned off, and the read voltage $V_{r1}$ is applied to the terminal of the first gate structure 510, and the read voltage $V_{r2}$ is applied to the terminal of the second gate structure 610 or grounding the terminal of the second gate structure 610. In a Voltage Divider Rule, the output voltage $V_{out}$ is a divided voltage between the upper and lower terminals. Hence, in response to determining that the first memristor 530 is in the high resistive state H and the second memristor 630 is in the low resistive state L (i.e., the write bit X is 1), the output voltage $V_{out}$ approaches 0 V. In response to determining that the first memristor 530 is in the low resistive state L and the second memristor 630 is in the high resistive state H (i.e., the write bit X is 0), the output voltage $V_{out}$ approaches 1 V. In addition, it can be seen from the equivalent circuit diagram in FIG. 4E and the output voltage distribution diagram drawn by measuring the high efficiency embedded-artificial synaptic elements 100 in FIG. 4F that there is a cell variation between the first memristor 530 and the second memristor 630, so that the output voltage $V_{out}$ has a distribution interval; nevertheless, the output result still has a read window that is more than ten times larger. Therefore, the operating method 800 of the high efficiency embedded-artificial synaptic element 100 of the present disclosure implements the logic gates of the NVM Latch by switching the high resistive state H and the low resistive state L of the first memristor 530, and switching the high resistive state H and the low resistive state L of the second memristor 630. The operating method 800 of the high efficiency embedded-artificial synaptic element 100 of the present disclosure can also determine the divided output voltage $V_{out}$ by the write bit X. Compared with the conventional digital switching method, the CIM of the present disclosure has the advantages of more stable output and higher efficient in the power consumption. Further, the state distribution of the output has a good read window even under the influence of the variation of manufacturing process and component.

Figure 5:
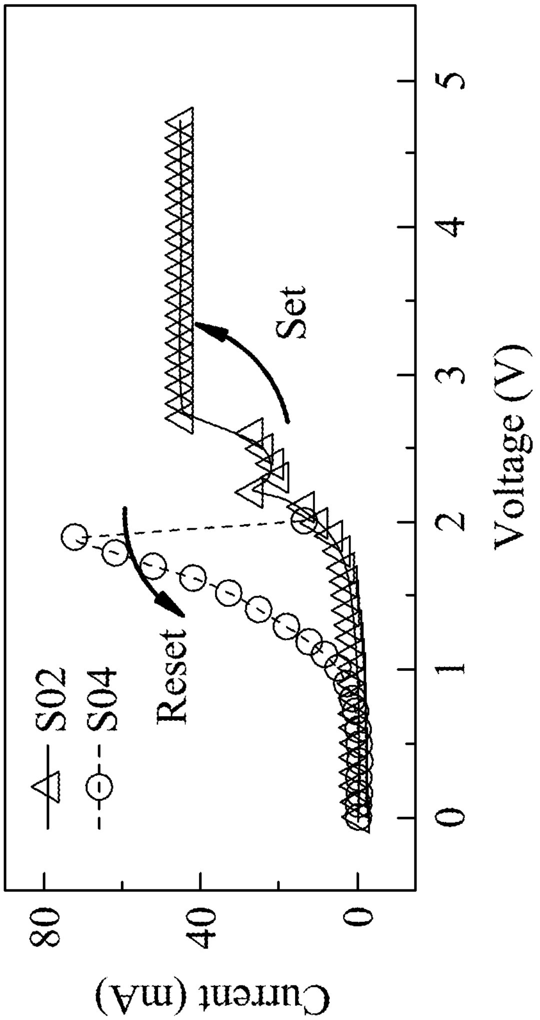
FIG. 5 shows a schematic view of a DC switching characteristic of a first gate structure of the high efficiency embedded-artificial synaptic element of the present disclosure.

Please refer to FIGS. 3, 4A, 4C and 5. FIG. 5 shows a schematic view of a DC switching characteristic of the first gate structure 510 of the high efficiency embedded-artificial synaptic element 100 of the present disclosure. Specifically, the horizontal axis of FIG. 5 represents a voltage applied to the first gate structure 510, and the vertical axis represents a current flowing through the first memristor 530. In the setting step S02, the first memristor 530 is initialized by applying the high voltage, and the first memristor 530 is set in the low resistive state L, and the initial current $I_1$ jumps to be a high current instantaneously. In the writing step S04, the first memristor 530 is reset to the high resistive state H by applying the low voltage, and the reset current $I_3$ drops to be a low current instantaneously. It is worth noting that there is a clear voltage interval between the high voltage applied for setting and the low voltage applied for resetting; thus, compared with the conventional synaptic element, the high efficiency embedded-artificial synaptic element 100 of the present disclosure has a larger operation window so as to avoid over-write. Further, in FIG. 5, since the high voltage applied in the setting step S02 can be 2.5 V to 3 V, the high efficiency embedded-artificial synaptic element 100 only needs to use a voltage less than 4 V, that is, the first memristor 530 and the second memristor 630 can be initialized, thereby having the effect of low-power consumption.

Figure 6:
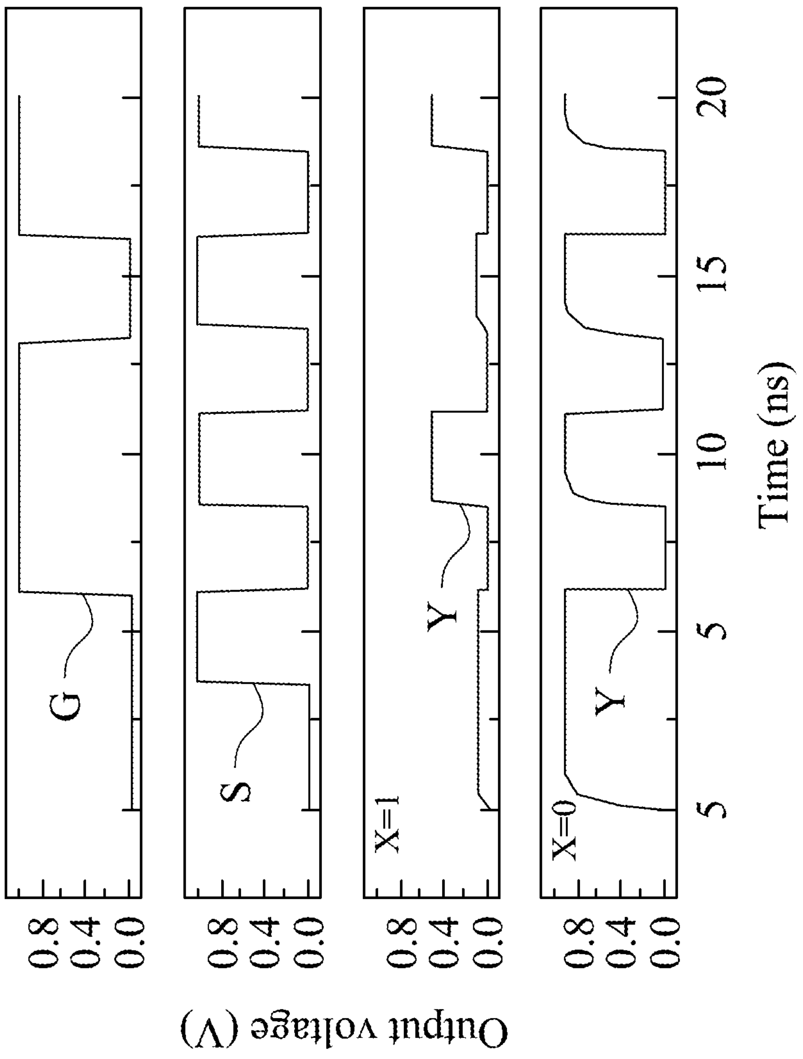
FIG. 6 shows an input/output timing chart of a nonvolatile memory latch formed by the high efficiency embedded-artificial synaptic element of the present disclosure.

Please refer to FIGS. 3, 4E and 6. FIG. 6 shows an input/output timing chart of a non-volatile memory latch formed by the high efficiency embedded-artificial synaptic element 100 of the present disclosure. As shown in FIG. 6, the output voltage $V_{out}$ corresponds to an output bit, and the output bit is represented as Y. A gate bit corresponding to the gate electrode 311 is represented as G. A source bit corresponding to the source region 330 of the select transistor 300 is represented as S. A first opposite bit corresponding to the gate bit G is represented as G'. A second opposite bit corresponding to the write bit X is represented as X', and the output bit Y satisfies the following condition: Y=GS+G'X'. For example, the select transistor 300 in the read step S06 is turned off, which represents that the input of the gate bit G is 0, the input of the first opposite bit G' is 1, and the source bit S can be negligible; thus, the output bit Y is equal to the second opposite bit X'.

Figure 7:
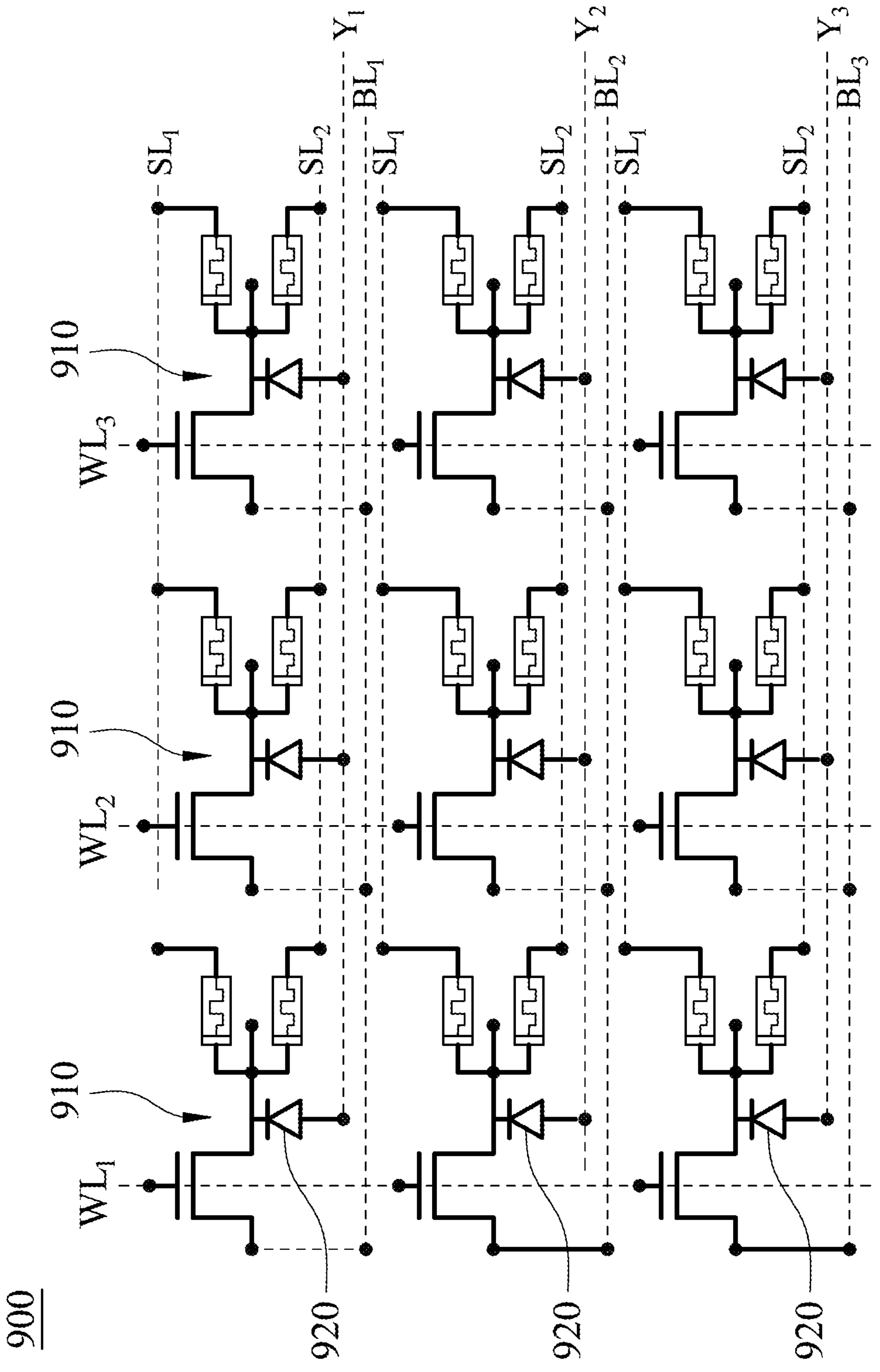
FIG. 7 shows an architecture schematic view of a neural network system according to a third embodiment of the present disclosure.

Please refer to FIG. 7. FIG. 7 shows an architecture schematic view of a neural network system 900 according to a third embodiment of the present disclosure. As shown in FIG. 7, the neural network system 900 includes a plurality of high efficiency embedded-artificial synaptic elements 910 and a plurality of diodes 920.

In the third embodiment, the high efficiency embedded-artificial synaptic elements 910 are arranged in a 3*3 array, but the present disclosure is not limited thereto. A metal layer of each of the high efficiency embedded-artificial synaptic elements 910 generates an output voltage. A select gate structure of a select transistor of each of the high efficiency embedded-artificial synaptic elements 910 arranged in one of columns is coupled to a word line $WL_1$. A select gate structure of a select transistor of each of the high efficiency embedded-artificial synaptic elements 910 arranged in another one of columns is coupled to a word line $WL_2$. A select gate structure of a select transistor of each of the high efficiency embedded-artificial synaptic elements 910 arranged in the last one of columns is coupled to a word line $WL_3$. A source region of a select transistor of each of the high efficiency embedded-artificial synaptic elements 910 arranged in one of rows is coupled to a bit line $BL_1$. A source region of a select transistor of each of the high efficiency embedded-artificial synaptic elements 910 arranged in another one of rows is coupled to a bit line $BL_2$. A source region of a select transistor of each of the high efficiency embedded-artificial synaptic elements 910 arranged in the last one of rows is coupled to a bit line $BL_3$. A first gate structure of a first memory transistor of each of the high efficiency embedded-artificial synaptic elements 910 arranged in each of rows is coupled to a first electrode line $SL_1$. A second gate structure of a second memory transistor of each of the high efficiency embedded-artificial synaptic elements 910 arranged in each of rows is coupled to a second electrode line $SL_2$. Each of the diodes 920 is coupled to the two metal layers of each two of the high efficiency embedded-artificial synaptic elements 910 adjacent to each other in a vertical direction. Each of the diodes 920 has an anode end. The anode ends of the diodes 920 arranged in one of rows are connected to each other and gather an output current $Y_1$. The anode ends of the diodes 920 arranged in another one of rows are connected to each other and gather an output current $Y_2$. The anode ends of the diodes 920 arranged in the last one of rows are connected to each other and gather an output current $Y_3$. Each of the diodes 920 determines whether to conduct or not according to the two output voltages of the two metal layers of each two of the high efficiency embedded-artificial synaptic elements 910 adjacent to each other in the vertical direction.

Specifically, the present disclosure extends the high efficiency embedded-artificial synaptic element 100 of the first embodiment to the 3*3 array to implement the neural network system 900 with stable CIM and low-power consumption. The conventional memristor neural network system stores the synaptic weights in the Multi-Level resistance Cell (MLC), and the current flowing through the memristor is determined by the resistive state of the memristor. Each of the memristors in the cross-point array is a synapse, and the summed element currents are similar to the vector dot product, and the system can exhibit an analog-additive operation when a specific bias is given to the system. However, the performance of the neural network system using the analog-additive memristors as the synapses is easily affected by the factors of tolerance, switching characteristics and linearity of the components themselves, which affect the accuracy of the aforementioned neural network system.

Different from the conventional cross-point array that controls the resistance of a single synaptic element as a weight, the neural network system 900 of the present disclosure utilizes the structure of the NVM Latch formed by the high efficiency embedded-artificial synaptic elements 910 to combine the CIM with the neural network, and calculates the analog weights by multiplying the digital outputs of the resistive switching between the first memristor and the second memristor in the high efficiency embedded-artificial synaptic elements 910. Each of the high efficiency embedded-artificial synaptic elements 910 can be operated independently by the selection transistor without affecting each other.

The operation method of the neural network system 900 is mainly divided into two stages, which are a restored synaptic state and a synaptic state. The same as the aforementioned operating method 800 of the high efficiency embedded-artificial synaptic element 100, in the restored synaptic state, the resistive states of the first memristor and the second memristor in the high efficiency embedded-artificial synaptic element 910 are set or reset to opposite resistive states by applying two bias voltages to the first electrode line $SL_1$ and the second electrode line $SL_2$, so that the diode 920 determines whether to conduct or not according to the two output voltages adjacent to each other in the vertical direction. In response to determining that the output voltage of the high efficiency embedded-artificial synaptic element 910 located on the upper end of the diode 920 is logic 0, and the output voltage of the high efficiency embedded-artificial synaptic element 910 located on the lower end of the diode 920 is logic 1, the diode 920 is turned on. On the contrary, in response to determining that the output voltage of the high efficiency embedded-artificial synaptic element 910 located on the upper end of the diode 920 is logic 1, and the output voltage of the high efficiency embedded-artificial synaptic element 910 located on the lower end of the diode 920 is logic 0, the diode 920 is turned off. The value of the output current $Y_1$ gathered from the diodes 920 arranged in row is the result of the sum of the currents that the three different diodes 920 are turned on or off, and the output currents $Y_2$, $Y_3$ and so on.

In the synaptic state, the bias voltage applied to the second electrode line $SL_2$ can be 0 V, and then the output voltage of the high efficiency embedded-artificial synaptic element 910 can be obtained by adjusting the bias voltage applied to the first electrode line $SL_1$ (the same as the reading step S06 in FIG. 4E); further, the breakover current of the diode 920 is changed, and more weight combinations are obtained to realize a more precise judgment. The following Table 2 lists each voltage applied to each terminal of the neural network system 900 by the operation method of the neural network system 900 in the restored synaptic state and the synaptic state.

TABLE 2

| | synaptic state bias condition | restored synaptic state: low resistive state to high resistive state | restored synaptic state: high resistive state to low resistive state |
|---|---|---|---|
| the word lines $WL_1$, $WL_2$, $WL_3$ | 0 V | 1 V | 0.5 V |
| the bit lines $BL_1$, $BL_2$, $BL_3$ | 0 V | 0 V | 0 V |
| the first electrode line $SL_1$ | 1 V to 2 V | 2.5 V | 5 V |
| the second electrode line $SL_2$ | 0 V | 0 V | 0 V |

Figure 8:
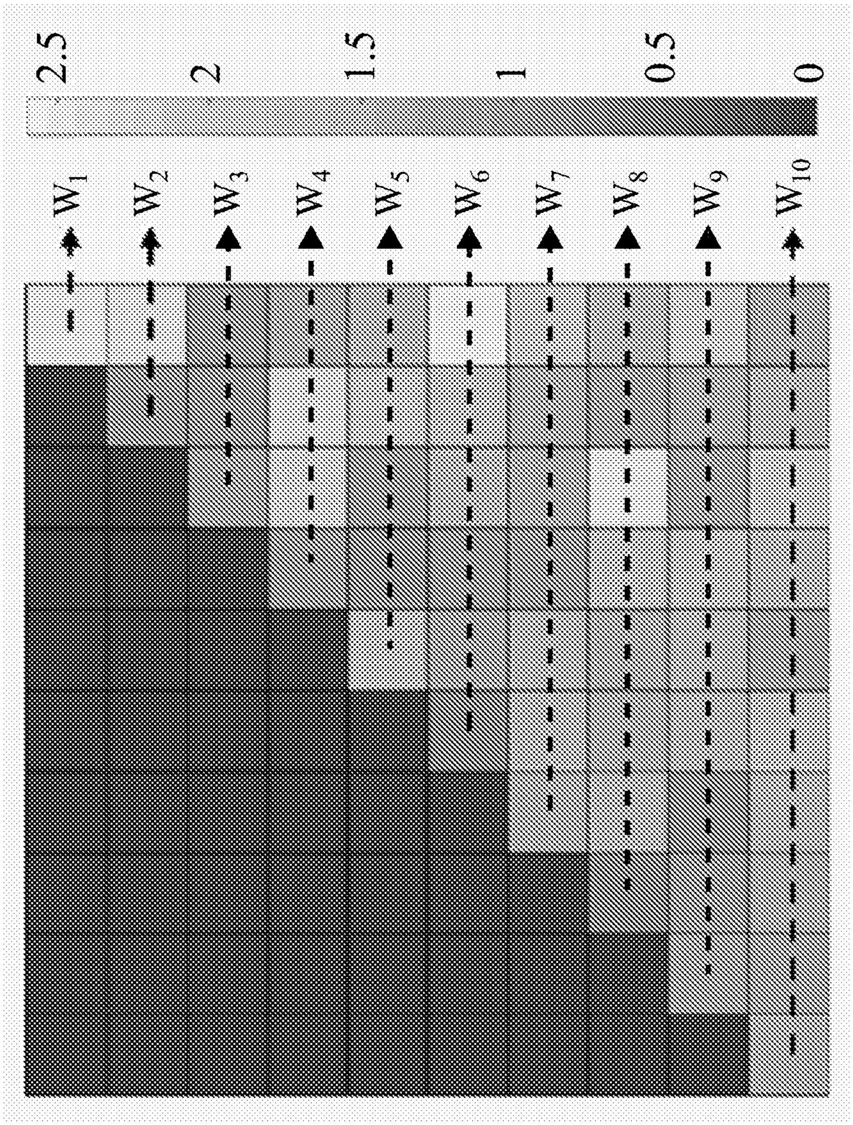
FIG. 8 shows a bitmap of a plurality of weights and a plurality of output currents of a neural network system according to a fourth embodiment of the present disclosure.

Please refer to FIG. 8. FIG. 8 shows a bitmap of a plurality of weights $W_1$, $W_2$, $W_3$, $W_4$, $W_5$, $W_6$, $W_7$, $W_8$, $W_9$, $W_{10}$ and a plurality of output currents of a neural network system according to a fourth embodiment of the present disclosure. Specifically, the neural network system of the fourth embodiment is a 10*10 array formed by extending the neural network system 900 of the third embodiment. As shown in FIG. 8, the output currents of the high efficiency embedded-artificial synaptic elements 910 from large to small exhibit a distribution from light to dark. In the first row, only one diode is turned on, and the weight is defined as $W_1$. In the second row, two diodes are turned on, the weight is defined as $W_2$, and so on. The weight $W_{10}$ represents that the breakover currents of ten diodes are accumulated, and have the largest weight in the 10*10 array. Therefore, the neural network system 900 of the present disclosure only needs to apply the bias voltage to the first electrode line $SL_1$ and the second electrode line $SL_2$ when updating the high efficiency embedded-artificial synaptic element 910, so that the first memristor and the second memristor can be set in opposite resistive states, and the conduction of the diode 920 is determined according to the two output voltages of the two high efficiency embedded-artificial synaptic elements 910 adjacent to each other in the vertical direction. Hence, the neural network system 900 of the present disclosure does not require complicated operations and reduces power consumption effectively. In addition, the neural network system 900 can obtain the output voltages of the high efficiency embedded-artificial synaptic elements 910 by adjusting the bias voltage; further, the output current of the diode 920 is changed, and more weight combinations are obtained.

In summary, the present disclosure has the following advantages. First, the present disclosure utilizes the metal layer to connect the drain region of the select transistor to the connection region, besides it can utilize the characteristics of the complementary resistive states of the first memristor and the second memristor to operate the twin bits in the high resistive state and the low resistive state, respectively, and form the structure of the NVM Latch. Second, the data output characteristic of the high efficiency embedded-artificial synaptic element of the present disclosure is more stable and higher efficient than the analogy access used by the conventional logic gates. Third, the high efficiency embedded-artificial synaptic element of the present disclosure still has a good reading window in the state distribution of the output even under the influence of the variation of manufacturing process and component.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A high efficiency embedded-artificial synaptic element, comprising:

a semiconductor substrate;

a select transistor disposed on the semiconductor substrate and comprising a select gate structure, a drain region and a source region, wherein the drain region and the source region are located on two opposite sides of the select gate structure, respectively;

a metal layer electrically connected to the drain region of the select transistor;

a first memory transistor disposed on the semiconductor substrate, wherein the first memory transistor comprises a first gate structure, a first electrode region and a first memristor;

a second memory transistor disposed on the semiconductor substrate, wherein the second memory transistor comprises a second gate structure, a second electrode region and a second memristor, the second electrode region and the first electrode region are connected to each other to form a connection region, and the connection region is electrically connected to the metal layer;

a first contact connected between the metal layer and the drain region of the select transistor; and a second contact connected between the metal layer and the connection region;

wherein the first memristor is formed between the first gate structure and the connection region, and the second memristor is formed between the second gate structure and the connection region;

wherein a length of the first contact is equal to a length of the second contact.

2. The high efficiency embedded-artificial synaptic element of claim 1, wherein the select transistor is a High-K Metal Gate (HKMG) N-type field effect transistor.

3. The high efficiency embedded-artificial synaptic element of claim 1, wherein the select gate structure comprises:

a gate electrode; and a spacer surrounding the gate electrode, wherein the drain region and the source region are aligned with the spacer on two opposite sides of the gate electrode.

4. The high efficiency embedded-artificial synaptic element of claim 1, further comprising:

a shallow trench isolation region disposed on the semiconductor substrate and located between the drain region of the select transistor and another first electrode region of the first memory transistor.

5. A neural network system, comprising:

a plurality of the high efficiency embedded-artificial synaptic elements of claim 1 arranged in array, wherein the metal layer of each of the high efficiency embedded-artificial synaptic elements generates an output voltage, the select gate structure of the select transistor of each of the high efficiency embedded-artificial synaptic elements arranged in column is coupled to a word line, the source region of the select transistor of each of the high efficiency embedded-artificial synaptic elements arranged in row is coupled to a bit line, the first gate structure of the first memory transistor of each of the high efficiency embedded-artificial synaptic elements arranged in row is coupled to a first electrode line, and the second gate structure of the second memory transistor of each of the high efficiency embedded-artificial synaptic elements arranged in row is coupled to a second electrode line; and a plurality of diodes, wherein each of the diodes is coupled to the two metal layers of each two of the high efficiency embedded-artificial synaptic elements adjacent to each other in a vertical direction, each of the diodes has an anode end, and the anode ends of the diodes arranged in row are connected to each other and gather an output current;

wherein each of the diodes determines whether to conduct or not according to the two output voltages of the two metal layers of each two of the high efficiency embedded-artificial synaptic elements adjacent to each other in the vertical direction.

* * * * *